(12) United States Patent
Liao et al.

(10) Patent No.: US 10,586,895 B2
(45) Date of Patent: Mar. 10, 2020

(54) LIGHT-EMITTING DIODE CHIP HAVING A PLURALITY OF INDENTATIONS

(71) Applicant: EPISTAR CORPORATION, Hsinchu (TW)

(72) Inventors: Han-Zhong Liao, Hsinchu (TW); Chih-Hsuan Lu, Hsinchu (TW); Fang-I Li, Hsinchu (TW); Wei-Kang Cheng, Hsinchu (TW); Shyi-Ming Pan, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/294,411

(22) Filed: Mar. 6, 2019

(65) Prior Publication Data

US 2019/0207061 A1     Jul. 4, 2019

Related U.S. Application Data

(63) Continuation of application No. 14/826,646, filed on Aug. 14, 2015, now Pat. No. 10,256,371, which is a
(Continued)

(30) Foreign Application Priority Data

Jan. 11, 2012  (TW) .............................. 101101147 A

(51) Int. Cl.
*H01L 33/42* (2010.01)
*H01L 33/20* (2010.01)
*H01L 33/38* (2010.01)

(52) U.S. Cl.
CPC .............. *H01L 33/42* (2013.01); *H01L 33/20* (2013.01); *H01L 33/38* (2013.01)

(58) Field of Classification Search
None
See application file for complete search history.

(56) References Cited

U.S. PATENT DOCUMENTS 9,130,129 B2    9/2015  Liao et al.
2005/0035364 A1*  2/2005  Sano ...................... B82Y 20/00
                                                        257/99
(Continued)

*Primary Examiner* — Bilkis Jahan
(74) *Attorney, Agent, or Firm* — Muncy, Geissler, Olds & Lowe, P.C.

(57) ABSTRACT

A LED chip including a first semiconductor layer; an active layer; a second semiconductor layer; a plurality of indentations, wherein each indentation extends downward to reach and expose the first semiconductor layer, wherein each indentation includes a bottom part and two side surfaces in a cross sectional view; an exposing area exposing the first semiconductor layer at a side of the LED chip; a first metal layer disposed on the second semiconductor layer and electrically connecting to the first semiconductor layer; and a first insulating layer formed between the first metal layer and the second semiconductor layer to isolate the first metal layer from the second semiconductor layer; wherein the first metal layer continuously extends to the plurality of indentations, covers the bottom part, the two side surfaces of each indentation and a top surface of the second semiconductor layer around the two side surfaces and contacts the exposing area; and wherein the first metal layer includes a plurality of recesses corresponding to the plurality of indentations.

8 Claims, 8 Drawing Sheets

Related U.S. Application Data continuation of application No. 13/715,120, filed on Dec. 14, 2012, now Pat. No. 9,130,129.

(56) References Cited

U.S. PATENT DOCUMENTS

| | | |
|---|---|---|
| 2005/0254243 A1 | 11/2005 | Jiang et al. |
| 2009/0101886 A1 | 4/2009 | Chang |
| 2010/0060157 A1* | 3/2010 | Shi ................ H01L 33/507 |
| | | 313/512 |
| 2010/0117111 A1 | 5/2010 | Illek et al. |
| 2010/0127274 A1 | 5/2010 | Yoo |
| 2011/0012146 A1* | 1/2011 | Hitsuda ............. H01L 33/405 |
| | | 257/94 |
| 2011/0140160 A1* | 6/2011 | Kim ................. H01L 33/44 |
| | | 257/99 |
| 2011/0156070 A1 | 6/2011 | Yoon et al. |
| 2011/0291145 A1 | 12/2011 | Han et al. |

* cited by examiner

LIGHT-EMITTING DIODE CHIP HAVING A PLURALITY OF INDENTATIONS

CROSS REFERENCE TO RELATED APPLICATIONS

This application is a Continuation application of U.S. patent application Ser. No. 14/826,646, filed on 14 Aug. 2015, which is a Continuation application of U.S. patent application Ser. No. 13/715,120, filed on 14 Dec. 2012, for which priority is claimed under 35 U.S.C. § 120; and this application claims priority of Application No. 101101147 filed in Taiwan on 11 Jan. 2012 under 35 U.S.C. § 119, the entire contents of all of which are hereby incorporated by reference.

BACKGROUND OF THE INVENTION

1. Fields of the Invention

The present invention relates to a light-emitting diode (LED) chip, especially to an LED chip comprising indirectly overlapped metal layers which are branched and distributed over a surface of the LED chip.

2. Descriptions of Related Art

A light-emitting diode (LED) is a light source made from semiconductor materials such as III-V group of semiconductors including gallium phosphide, gallium arsenide, etc. When a voltage is applied to the semiconductor, electrons and holes meet and recombine under electrode voltage difference. At this moment, the electrons fall to the lower energy level and the energy is released in the form of photons. The electric power is converted to light that is emitted out.

Due to exhaustion of non-renewable resources including coal, natural gas, petroleum, etc, energy saving products also need development besides developing new energy sources to slow down consumption of fossil fuels. Under the pressure of unstable oil prices, countries worldwide are dedicated to develop energy saving products. Thus technologies of light-emitting diode, a so-called green light source, become more mature over time, and the application fields thereof get broader. Right now LED's have been widely used in indicators and display of computer, communication and consumer electronics (3C) products. Along with increasing yield rate of LED's, manufacturing cost per each unit of LED is significantly reduced, prompting adoption of LED as lighting material in various fields.

As mentioned above, since development of high brightness LED has been a research emphasis of manufacturers in most countries, how to further enhance the efficiency of the LED shall be the focus to be stressed for improvement.

Refer to FIG. 1, a lateral light-emitting diode chip basically comprises a substrate 10, a first semiconductor layer 11, an active layer 12, a second semiconductor layer 13, a first electrode 40 and a second electrode 41. As shown in the figure, the first semiconductor layer 11 which is an n-type semiconductor is disposed on the substrate 10, and the active layer 12 is disposed on the first semiconductor layer 11. Then the second semiconductor layer 13 which is a p-type semiconductor is disposed on the active layer 12. The first electrode 40 and the second electrode 41 are respectively disposed on the first semiconductor layer 11 and the second semiconductor layer 13. While in use, an external voltage is applied to the light-emitting diode chip through the electrodes to make the active layer 12 emit light. Because the current tends to traverse the shortest pathway, the current flows downward vertically from the second electrode 41 through the second semiconductor layer 13 and then arrives the active layer 12. Such that the main emission area of the active layer 12 is restricted to a region just below the second electrode 41 and the neighborhood. As to the area farther, the emission efficiency thereof is lowered due to less current passed.

SUMMARY OF THE INVENTION

The present application provides a light-emitting diode (LED) chip including a first semiconductor layer; an active layer disposed on the first semiconductor layer; a second semiconductor layer disposed on the active layer; a plurality of indentations, wherein each indentation extends downward to reach the first semiconductor layer and exposes the first semiconductor layer, wherein each indentation includes a bottom part and two side surfaces in a cross sectional view; an exposing area exposing the first semiconductor layer at a side of the LED chip; a first metal layer disposed on the second semiconductor layer and electrically connecting to the first semiconductor layer; and a first insulating layer deposited on the second semiconductor layer and between the first metal layer and the second semiconductor layer to isolate the first metal layer from the second semiconductor layer; wherein the first metal layer continuously extends to the plurality of indentations, covers the bottom part, the two side surfaces of each indentation and a top surface of the second semiconductor layer around the two side surfaces and contacts the exposing area; and wherein the first metal layer includes a plurality of recesses corresponding to the plurality of indentations.

DETAILED DESCRIPTION OF THE PREFERRED EMBODIMENT

Figure 1:
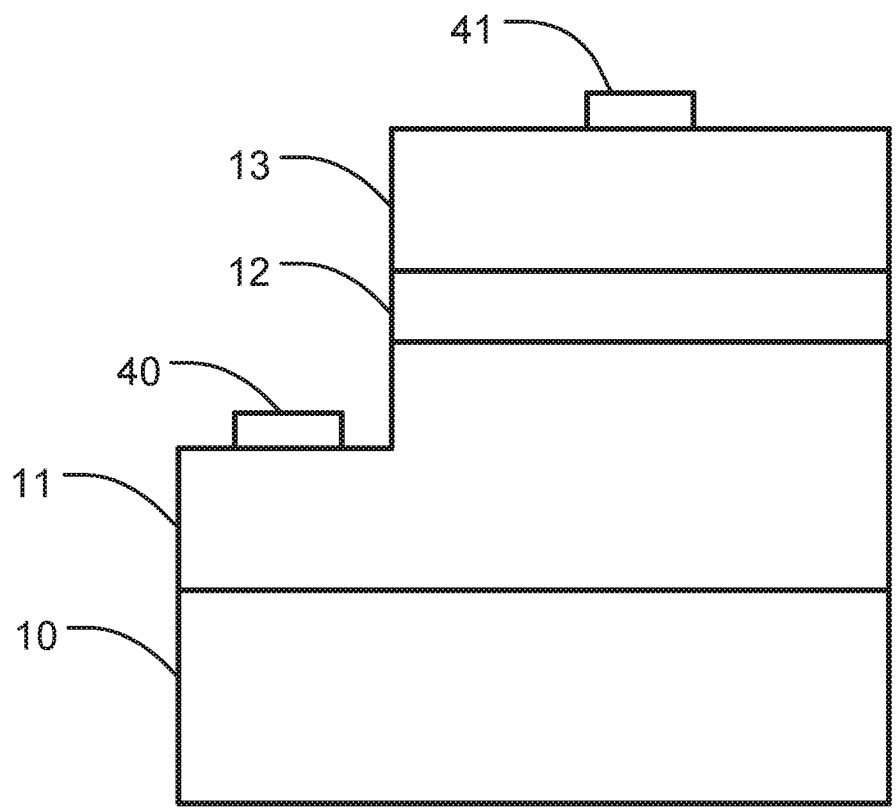
FIG. 1 is a schematic drawing showing structure of an LED chip.
Figure 2:
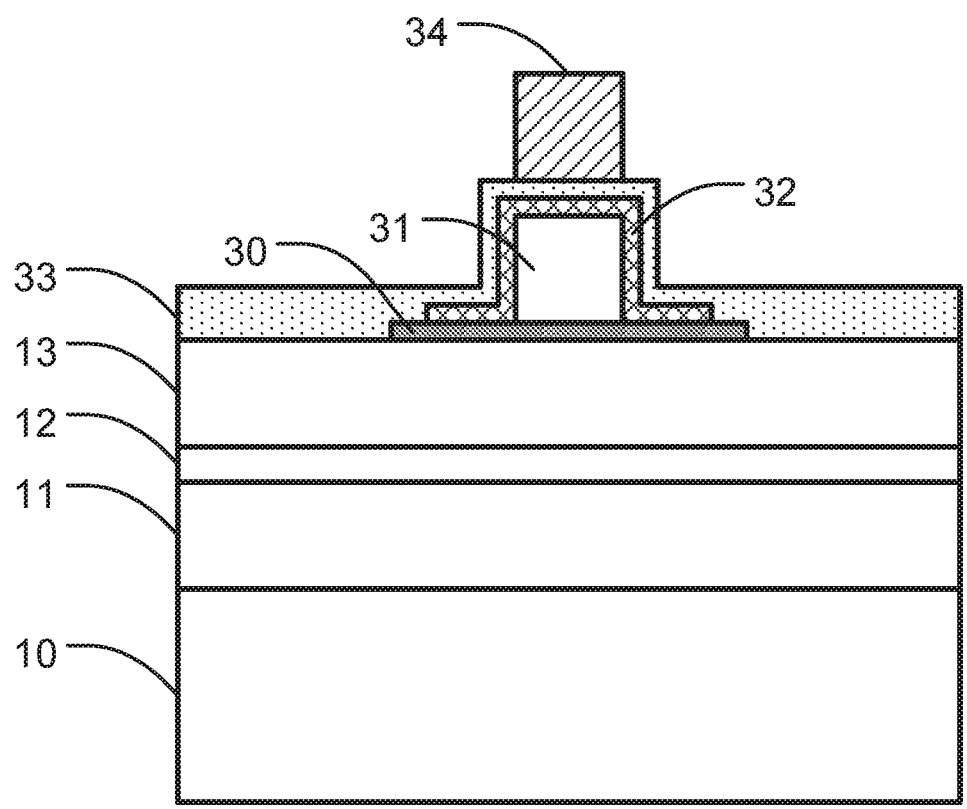
FIG. 2 is a schematic drawing showing a cross section of the embodiment according to the present invention.
Figure 3:
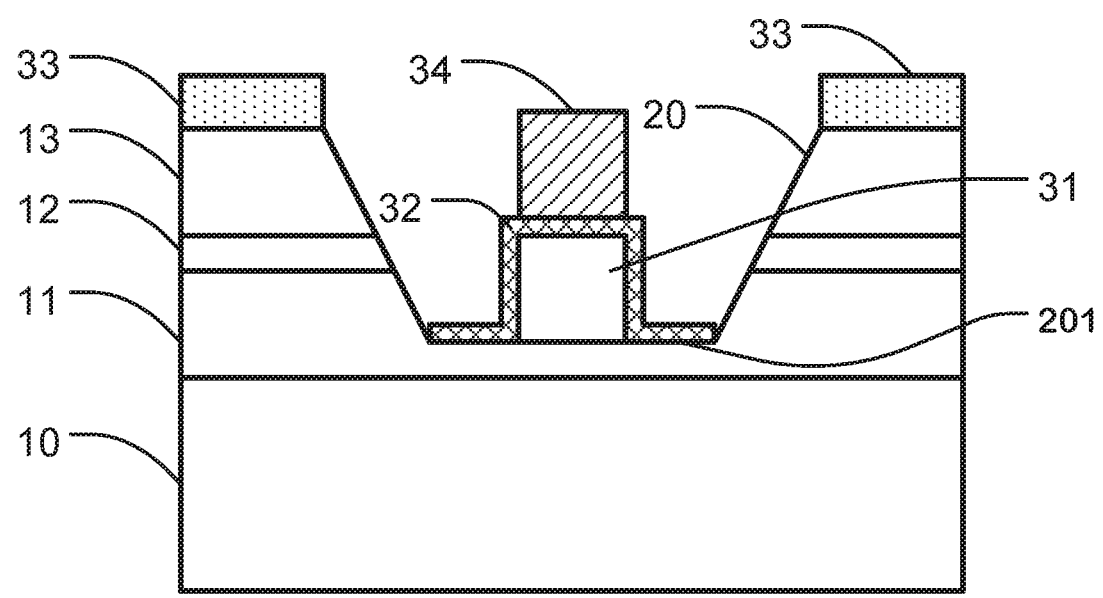
FIG. 3 is a schematic drawing showing a cross section of the embodiment comprising an indentation according to the present invention.

An embodiment according to the present invention, as shown in FIG. 2 and FIG. 3, is an LED chip comprising a substrate 10, a first semiconductor layer 11 deposited on the substrate 10, an active layer 12 deposited on the portion of the semiconductor layer 11, a second semiconductor layer 13 deposited on the active layer 12, at least one indentation 20 (Another embodiment comprises a plurality of indentation 20) comprising a bottom part 201 deposited on the second semiconductor layer 13; a first insulating layer 30, a first metal layer 31, a second insulating layer 32, a transparent conductive layer 33, and a second metal layer 34 deposited on the second semiconductor layer 13 sequentially. Wherein the bottom part 201 of indentation 20 extends downward to reach the first semiconductor layer 11.

Further, the first insulating layer 30 is disposed on a portion of the second semiconductor layer 13 to separated the first metal layer 31 and the second semiconductor layer 13 as shown in FIG. 2. At the position of the indentation 20 as shown in FIG. 3, the first semiconductor layer 11 is exposed at the bottom part 201, the first metal layer 31 is disposed on the first insulating layer 30 at the bottom part 201 of the indentation 20, so that the first metal layer 31 can electrically connects to the first semiconductor layer 11. The second insulating layer 32 covers at least a portion of the first metal layer 31. The transparent conductive layer 33 is disposed on the second semiconductor layer 13 and the second insulating layer 32, and the second metal layer 34 is disposed on the second transparent conductive layer 33 and the second insulating layer 32.

According to the structure of the present invention described forward, while the first metal layer 31 is disposed on the second semiconductor layer 13, the first metal layer 31 is isolated by the first insulating layer 30 and the second insulating layer 32. And while the first metal layer 31 proceeds to the bottom part 201 of the indentation 20, the first metal layer 31 connects to the first semiconductor layer 11 smoothly because the first insulating layer 30 does not extend to the bottom part 201, thereby achieving the goal of current spreading.

Figure 4:
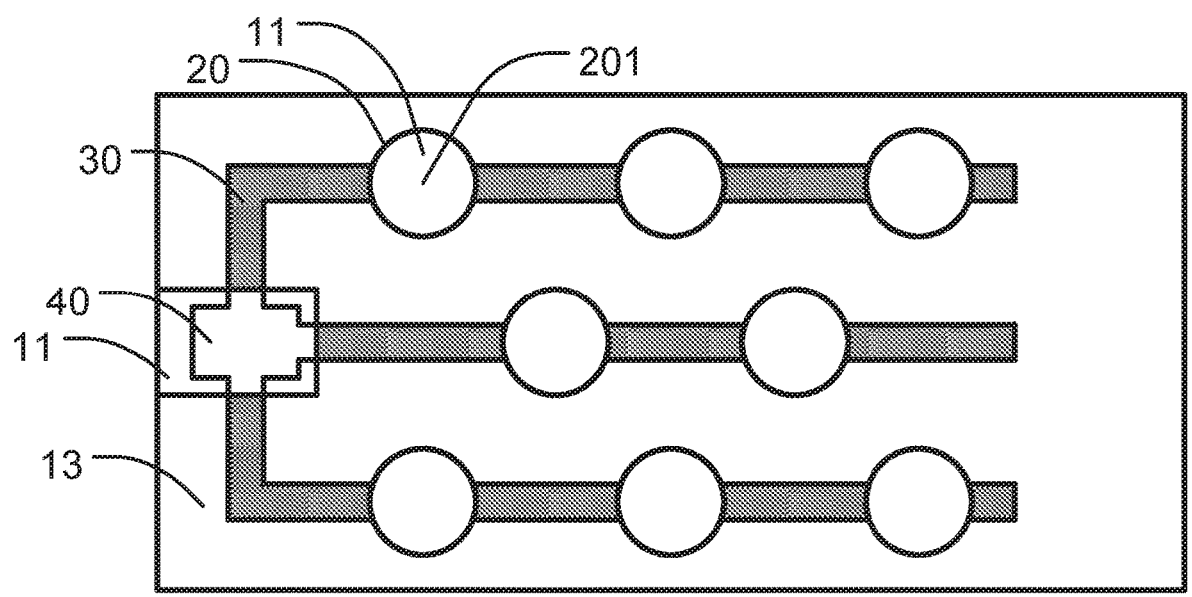
FIG. 4 is a schematic drawing showing a top view of the embodiment without the transparent conductive layer according to the present invention.

FIG. 4 is a schematic drawing showing a top view of the embodiment of the present invention without the transparent conductive layer 33 and the second metal layer 34. As shown in the figure, the LED chip of the present invention further comprises a first electrode 40 which connected to the first metal layer 31 deposited on the first semiconductor layer 11, and a plurality of the indentations 20 are distributed over the surface of the LED chip wherein the bottom part 201 of each indentation exposes the first semiconductor layer 11 which originally covered by the active layer 12 and the second semiconductor layer 13. The LED chip further comprises a branched-strip metal cover region which distributed like fingers is disposed on the second semiconductor layer 13, where the first insulating layer 30 is disposed thereon and along edges of the indentations 20 without passing through the bottom parts 201. So that the first metal layer 31 deposited on the insulating layer 30 will not contact the active layer 12 or the second semiconductor layer 13 resulting in short circuit. In other words, under electrical isolation from the second semiconductor layer 13 by the first insulating layer 30, the first metal layer 31 deposited on the first insulating layer 30 can still connects to the first semiconductor layer 11 at the bottom parts 201 of the indentations 20.

Figure 5:
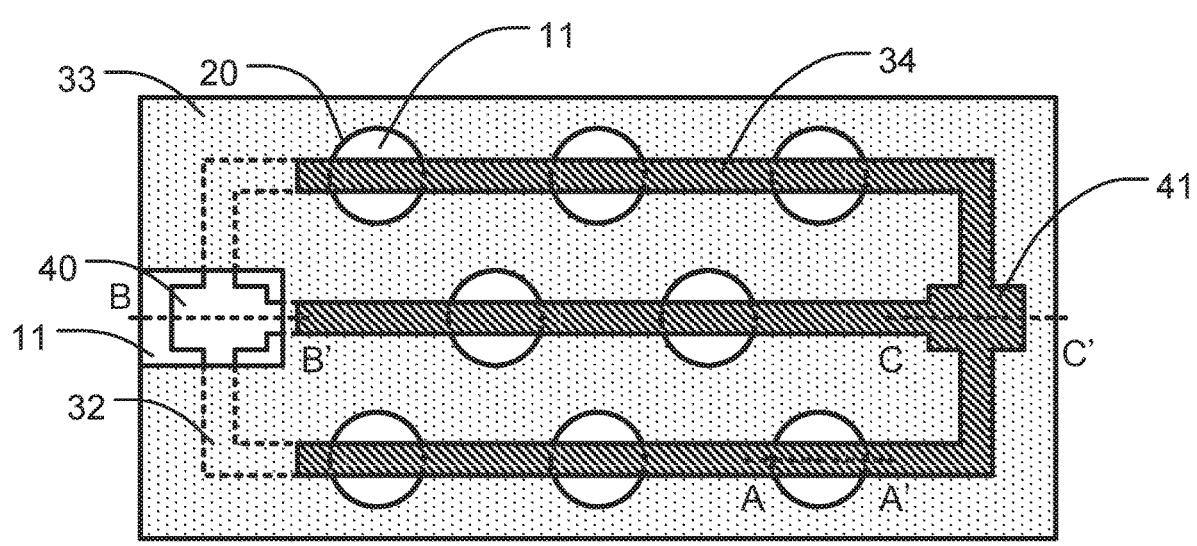
FIG. 5 is a schematic drawing showing a top view of the embodiment according to the present invention.

FIG. 5 is a schematic drawing showing a top view of the embodiment of the present invention as illustrated in FIG. 4 further deposited the transparent conductive layer 33, the second metal layer 34, and the second electrode 41. As shown in the figure, the LED chip of the present invention further comprises a second electrode 41 which connected to the second metal layer 34 deposited on the transparent conductive layer 33 which completely covered the second semiconductor layer 13, and the second insulating layer 32 deposited between the first metal layer 31 and the second metal layer 34. Wherein the transparent conductive layer 33 further covered the second insulating layer 32, the first metal layer 31, and the first insulating layer 30.

Regarding to material of the structure of the embodiment described forward, when the first semiconductor layer 11 is an n-type semiconductor layer, the second semiconductor layer 13 is a p-type semiconductor layer. And accordingly, the first electrode 40 is an n-type electrode and the second electrode 41 is a p-type electrode. On the other hand, when the first semiconductor layer 11 is a p-type semiconductor layer, the second semiconductor layer 13 is an n-type semiconductor layer; and the first electrode 40 is a p-type electrode, the second electrode 41 is an n-type electrode. And the transparent conductive layer 33 comprises indium tin oxide that is a mixture of indium oxide ($In_2O_3$) and tin oxide ($SnO_2$). Generally, the mass ratio of the mixture is 90% $In_2O_3$ and 10% $SnO_2$. When indium tin oxide is in a film form, it is transparent and conductive. Thus, light emitted from the active layer 12 can pass the transparent conductive layer 33 smoothly. Moreover, due to conductivity of the transparent conductive layer 33, current generated by the voltage applied to the second metal layer 34 can flow to the second semiconductor layer 13 through conduction of the transparent conductive layer 33.

In order to disclose the structure of the LED chip of the present invention in more detail, the cross sections at line A-A', B-B', and C-C' of FIG. 5 are illustrated as backward.

Figure 6:
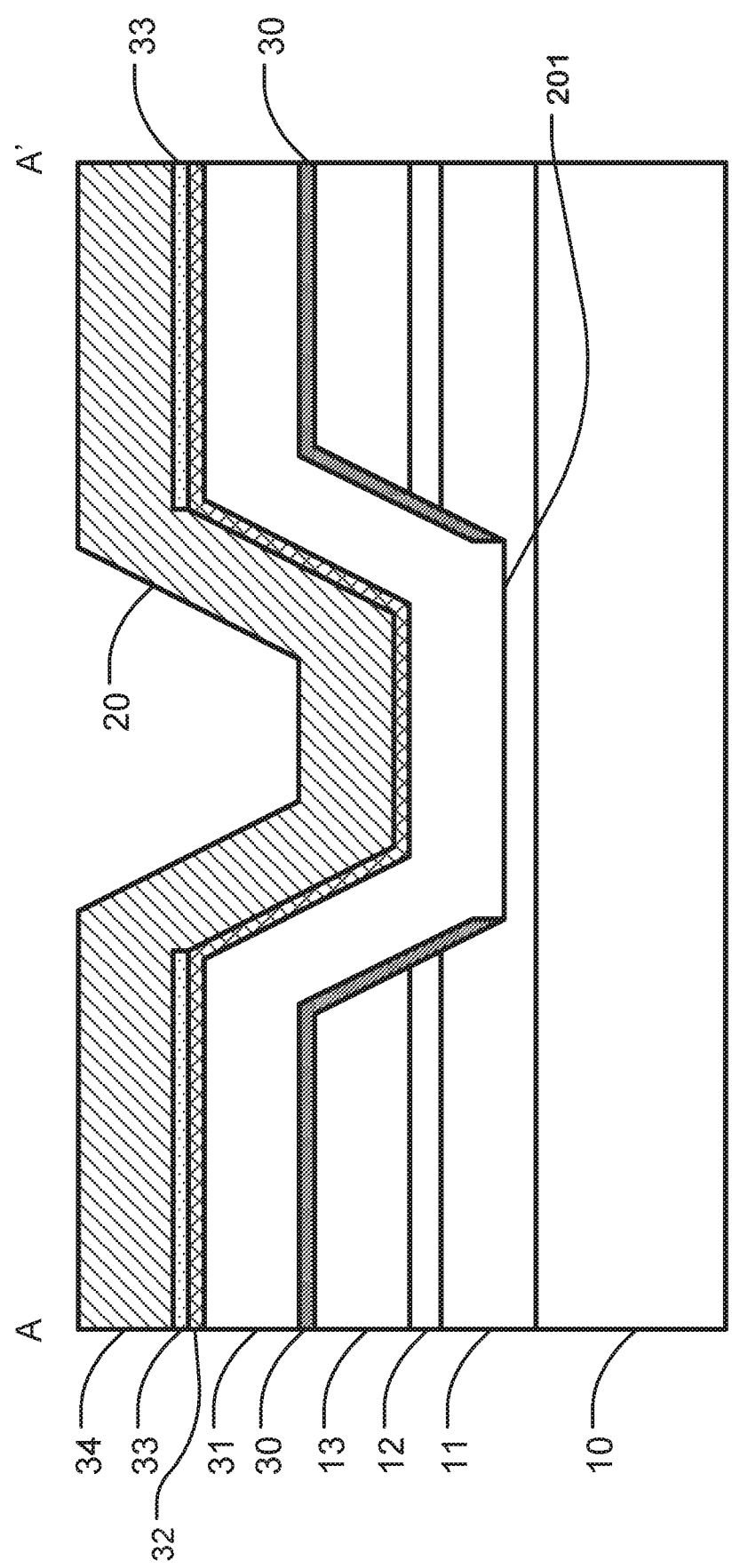
FIG. 6 is a schematic drawing showing a cross section of line A-A' of FIG. 5 according to the present invention.

As shown in FIG. 6, the cross section at the line A-A' of FIG. 5 illustrated the structure of indentation 20 of the LED chip of the present invention, the first metal layer 31 connects to the first semiconductor layer 11 at the bottom part 201. The first insulating layer 30 effectively isolates the first metal layer 31 from the second semiconductor layer 13 or the active layer 12, so that the LED chip can operate normally under the structure comprising indentations.

As shown in FIG. 4 to FIG. 6, the LED chip of the present invention comprises the first metal layer 31 and the second metal layer 34 which are arranged into an indirect overlapping structure and electrically isolated with each other by the second insulating layer 32. And the metal layers with the indirect overlapping structure are branched into several strips like fingers and distributed on the surface of the LED chip, then the electric current can be distributed and flows more evenly, which increasing not only the emission area of the active layer 12 but also the emission efficiency. In order to achieve the indirect overlapping, the shape and volume of the overlapped portions of the first metal layer 31 and the second metal layer 34 are the same, and the first metal layer 31 and the second metal layer 34 comprise metal compound. In order to decrease and avoid any possible shielding on the active layer 12 caused by stacking of the metal layers there above, the first metal layer 31 and the second metal layer 34 are overlapped mostly and precisely from the top view of the LED chip of the present invention to ensure the light extraction efficiency.

Figure 7:
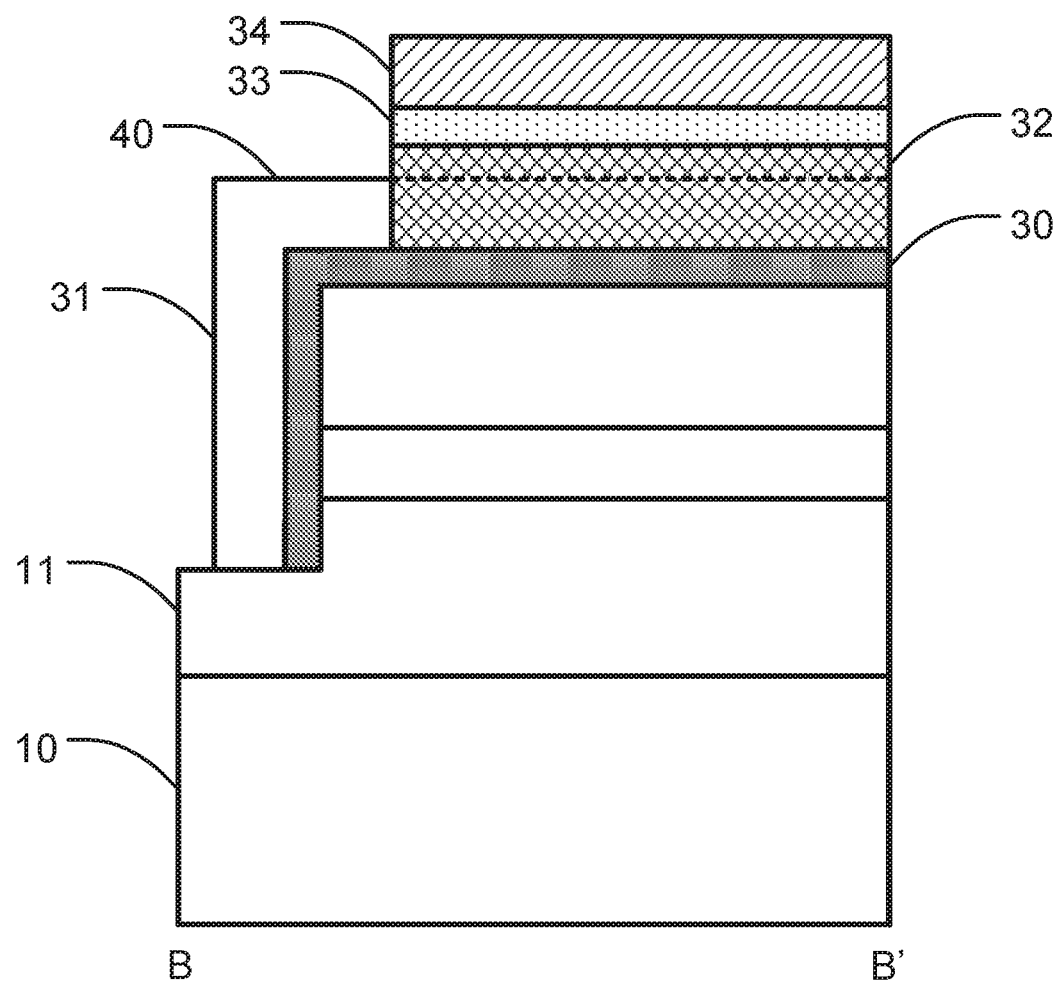
FIG. 7 is a schematic drawing showing a cross section of line B-B' of FIG. 5 according to the present invention.

As shown in FIG. 7, the cross section at the line B-B' of FIG. 5 illustrated the structure at the position of the first electrode 40 of the LED chip of the present invention, the first electrode 40 disposed on the first semiconductor layer 11 is located on one side of the LED chip, and connects to the first metal layer 31 along the first insulating layer 30 which separated/isolated the electrode 40 and the first metal layer 31 from the second semiconductor layer 13 and the active layer 12 to prevent short circuit.

Figure 8:
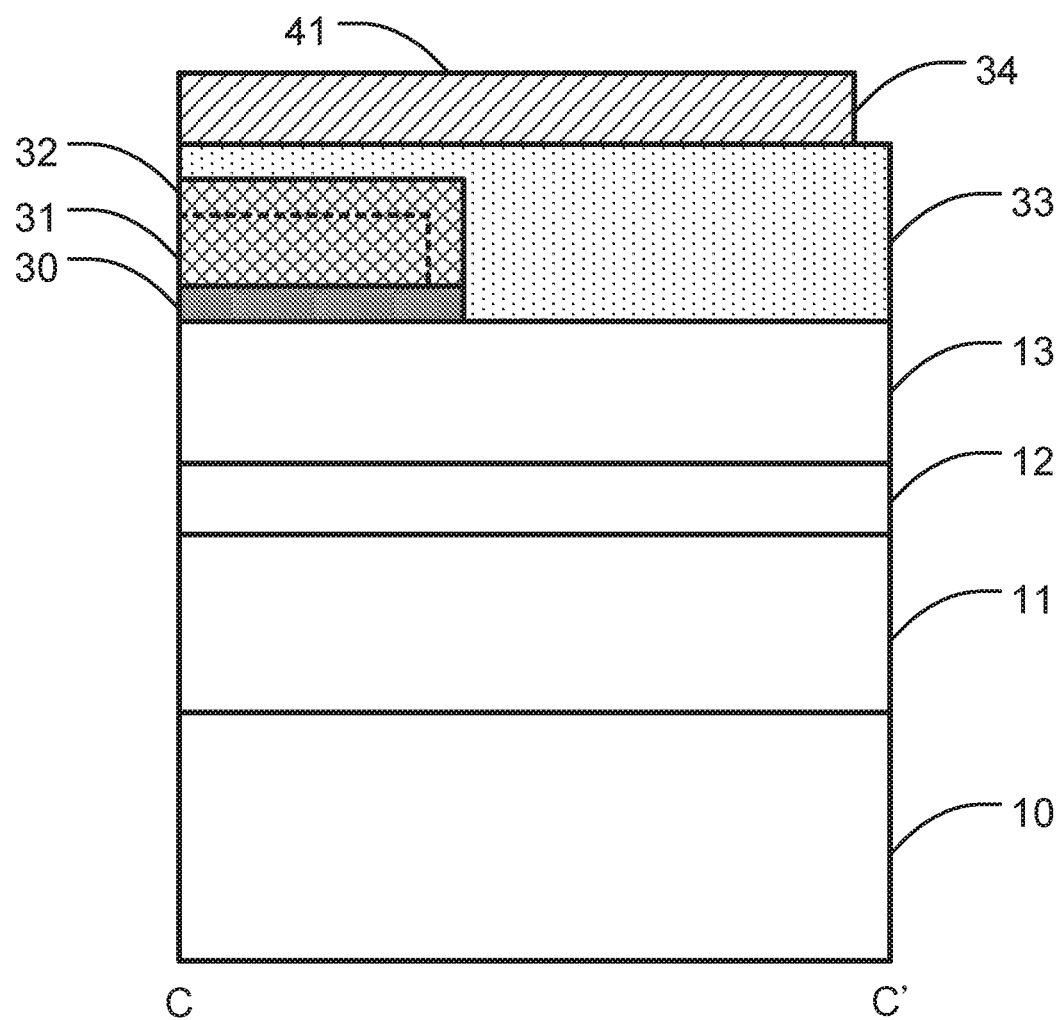
FIG. 8 is a schematic drawing showing a cross section of line C-C' of FIG. 5 according to the present invention.

As shown in FIG. 8, the cross section at the line C-C' of FIG. 5 illustrated the structure at the position of the second electrode 41 of the LED chip of the present invention, the second electrode 41 disposed on the transparent conductive layer 33 is located on the other side of the LED chip, and connects to the second metal layer 34. The first electrode 40 and the second electrode 41 are positioning for wire bonding of the LED chip with adjacent LED chips or a power source. By bonding wires made of gold, a voltage can be applied to the LED chip of the present invention to emit light.

According to the present invention as illustrated forward, the first metal layer 31 electrically connects to the first semiconductor layer 11 at the bottom part 201 of each indentation 20. Then the current can flow along a path formed by the second metal layer 34, the transparent conductive layer 33, the second semiconductor layer 13, the active layer 12, the first semiconductor layer 11, and the first metal layer 31, so as to make the active layer 12 emit light evenly and enhancing the light emission efficiency. Because the voltage applied is distributed evenly by the branched-strip design, the region far away from the center of the LED can still get the same voltage supply through the branched-strip distribution of the overlapped metal layers. And there is needless to reduce the area of the active layer 12 and the second semiconductor layer 13 greatly for exposing the electrode on the first semiconductor layer 11. Therefore the present invention increases a ratio of the area of the active layer 12 to that of the overall chip, the light extraction area the light extraction efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting diode (LED) chip, comprising:
   a first semiconductor layer;
   an active layer disposed on the first semiconductor layer;
   a second semiconductor layer disposed on the active layer;
   a plurality of indentations, wherein each indentation extends downward to reach the first semiconductor layer and exposes the first semiconductor layer, wherein each indentation comprises a bottom part and two side surfaces in a cross sectional view;
   an exposing area exposing the first semiconductor layer at a side of the LED chip;
   a first metal layer disposed on the second semiconductor layer and electrically connecting to the first semiconductor layer; and
   a first insulating layer formed on the second semiconductor layer and between the first metal layer and the second semiconductor layer to isolate the first metal layer from the second semiconductor layer;
   wherein the first metal layer continuously extends to the plurality of indentations, covers the bottom part, the two side surfaces of each indentation and a top surface of the second semiconductor layer around the two side surfaces and contacts the exposing area; and
   wherein the first metal layer comprises a plurality of recesses corresponding to the plurality of indentations.

2. The LED chip as claimed in claim 1, further comprising a second metal layer disposed on the second semiconductor layer and above the first metal layer.

3. The LED chip as claimed in claim 1, wherein the plurality of the indentations distributed over a surface of the LED chip.

4. The LED chip as claimed in claim 2, further comprising a second insulating layer disposed on the first metal layer and between the first metal layer and the second metal layer to isolate the first metal layer from the second metal layer.

5. The LED chip as claimed in claim 1, further comprising a transparent conductive layer formed on the second semiconductor layer.

6. The LED chip as claimed in claim 1, wherein the first insulating layer is disposed along the two side surfaces of each indentation.

7. The LED chip as claimed in claim 1, wherein the first metal layer covers the two side surfaces of each indention to connect to the first semiconductor layer.

8. The LED chip as claimed in claim 1, further comprising a substrate under the first semiconductor layer, and wherein the first semiconductor layer comprises a side surface connecting to the exposing area and the side surface of the first semiconductor layer connects to a side surface of the substrate.

* * * * *